United States Patent
Sato et al.

(10) Patent No.: US 11,807,711 B2
(45) Date of Patent: Nov. 7, 2023

(54) PHENOXY RESIN, RESIN COMPOSITION INCLUDING SAME, CURED OBJECT OBTAINED THEREFROM, AND PRODUCTION METHOD THEREFOR

(71) Applicant: NIPPON STEEL CHEMICAL & MATERIAL CO., LTD., Tokyo (JP)

(72) Inventors: Hiroshi Sato, Tokyo (JP); Kazuo Ishihara, Tokyo (JP)

(73) Assignee: NIPPON STEEL CHEMICAL & MATERIAL CO., LTD., Tokyo (JP)

(*) Notice: Subject to any disclaimer, the term of this patent is extended or adjusted under 35 U.S.C. 154(b) by 247 days.

(21) Appl. No.: 17/296,348

(22) PCT Filed: Dec. 9, 2019

(86) PCT No.: PCT/JP2019/048057
§ 371 (c)(1),
(2) Date: May 24, 2021

(87) PCT Pub. No.: WO2020/129727
PCT Pub. Date: Jun. 25, 2020

(65) Prior Publication Data
US 2022/0098360 A1    Mar. 31, 2022

(30) Foreign Application Priority Data
Dec. 21, 2018    (JP) .................... 2018-239684

(51) Int. Cl.
| C08G 59/06 | (2006.01) |
| C08G 59/24 | (2006.01) |
| C08G 59/32 | (2006.01) |
| C08G 59/40 | (2006.01) |
| C08G 59/50 | (2006.01) |
| C08G 59/68 | (2006.01) |
| C08G 65/40 | (2006.01) |
| C08L 63/04 | (2006.01) |
| H05K 3/46  | (2006.01) |

(52) U.S. Cl.
CPC ......... *C08G 59/066* (2013.01); *C08G 59/245* (2013.01); *C08G 59/32* (2013.01); *C08G 59/4021* (2013.01); *C08G 59/5073* (2013.01); *C08G 59/686* (2013.01); *C08G 59/688* (2013.01); *C08G 65/40* (2013.01); *C08L 63/04* (2013.01); *H05K 3/4655* (2013.01); *C08L 2201/08* (2013.01); *C08L 2203/20* (2013.01)

(58) Field of Classification Search
CPC ............ H05K 2201/015; C08G 59/066; C08G 59/245; C08G 65/40
See application file for complete search history.

(56) References Cited

U.S. PATENT DOCUMENTS

| 6,451,878 B1 | 9/2002 | Fukuzawa et al. |
| 2017/0173850 A1* | 6/2017 | Zento ................. B32B 27/365 |
| 2022/0185977 A1* | 6/2022 | Takahashi ............. C08J 5/042 |

FOREIGN PATENT DOCUMENTS

| JP | 2001-261789 A | 9/2001 |
| JP | 2003-252951 A | 9/2003 |
| JP | 2006-176658 A | 7/2006 |
| JP | 2014-132074 A | 7/2014 |
| JP | 2015-193738 A | 11/2015 |
| JP | 2017-031311 A | 2/2017 |
| JP | 2017-206641 A | 11/2017 |

* cited by examiner

*Primary Examiner* — Megan McCulley
(74) *Attorney, Agent, or Firm* — Locke Lord LLP; James E. Armstrong, IV; Nicholas J. DiCeglie, Jr.

(57) ABSTRACT

Provided are a phenoxy resin having excellent heat resistance, low hygroscopicity, and solvent solubility, a resin composition using the same, and a cured object obtained therefrom. The phenoxy resin is represented by Formula (1) below and has an Mw of 10,000 to 200,000:

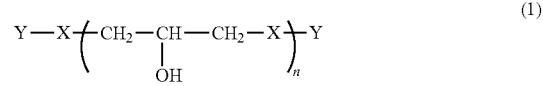

(1)

where, X represents a divalent group, and includes, essentially, a group having a cyclohexane ring structure and a group having a fluorene ring structure. Y represents a hydrogen atom or a glycidyl group. n is the number of repetitions and an average value thereof is 25 to 500.

15 Claims, 1 Drawing Sheet

[Fig. 1]
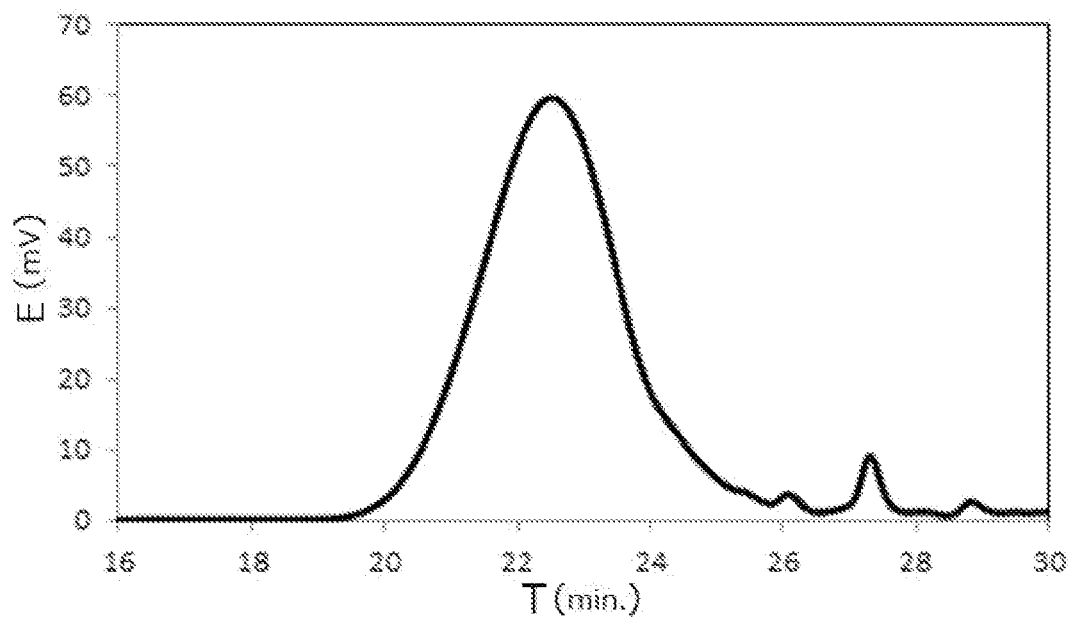
[Fig. 2]
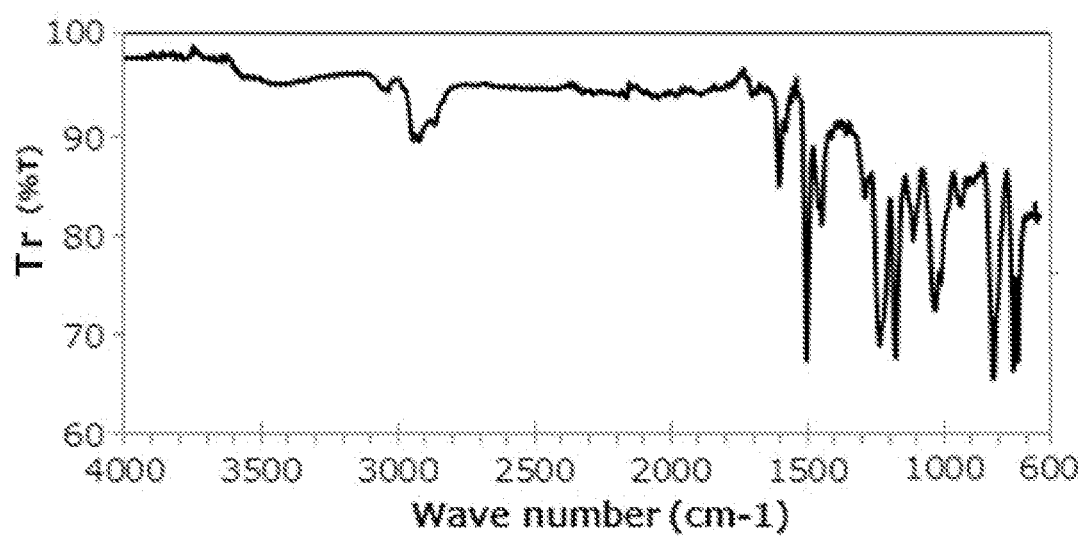

PHENOXY RESIN, RESIN COMPOSITION INCLUDING SAME, CURED OBJECT OBTAINED THEREFROM, AND PRODUCTION METHOD THEREFOR

TECHNICAL FIELD

The present invention relates to a phenoxy resin having high heat resistance and excellent solvent solubility and water resistance and a production method therefor. In addition, the present invention relates to a resin composition including the phenoxy resin and a curable resin component, and a cured object obtained therefrom.

BACKGROUND ART

Epoxy resins are widely used in paint, civil engineering adhesives, and electrical applications. To the epoxy resins, film-forming properties are imparted by increasing the molecular weight by various methods. A high molecular weight epoxy resin is a so-called "phenoxy resin". In particular, a bisphenol A type phenoxy resin is mainly used as a base resin varnish for paint and a base resin for film molding or is used to adjust fluidity by being added to an epoxy resin varnish and to improve toughness and improve adhesiveness when being formed into a cured object. In addition, those having phosphorus atoms or bromine atoms in a framework are used as a flame retardant to be added to an epoxy resin composition or a thermoplastic resin.

In particular, for printed wiring boards used in electrical and electronic devices, as devices become smaller, lighter, and more functional, there are demands for more layers, higher density, thinner thickness, lighter weight, higher reliability, and moldability. In response to such demands, a high-performance epoxy resin suitable for a new method for producing a multi-layer printed wiring board such as a build-up method is required.

As resins for satisfying such demands, use of a bisphenol A type epoxy resin or a multifunctional type epoxy resin has been proposed, but there are few resins that are satisfactory with respect to heat resistance, moldability, and electrical characteristics. Under these circumstances, phenoxy resins having excellent film-forming properties, adhesiveness, and flexibility have been focused on. However, conventional bisphenol A type high-molecular-weight epoxy resins and brominated phenoxy resins copolymerized with tetrabromobisphenol A to impart flame retardance cannot satisfy the requirements for heat resistance, adhesiveness, and low hygroscopicity, or are not preferable in consideration of the environment.

In response to the above requirements, a high-molecular weight epoxy resin having a bisphenol S structure has been disclosed as a phenoxy resin having high heat resistance, and this has a high glass transition temperature (Tg) but does not satisfy the requirement for low hygroscopicity (PTL 1). In addition, a high-molecular-weight epoxy resin having a bisphenol acetophenone structure and a bisphenol fluorenone structure has been disclosed, but is still insufficient for some applications despite a high Tg (PTL 2). In addition, a polyether polyol resin having an alicyclic structure has been disclosed as a phenoxy resin having low hygroscopicity, and although this satisfies the requirement for low hygroscopicity, the Tg is insufficient (PTL 3).

CITATION LIST

Patent Literature

[PTL 1] JP2001-261789 A
[PTL 2] JP2003-252951 A
[PTL 3] JP2006-176658 A

SUMMARY OF INVENTION

The present invention has been made in order to address these problems and an object of the present invention is to provide: a phenoxy resin in which the resin itself has a high glass transition temperature, and which has excellent solvent solubility, adhesiveness, and film-forming properties, and can provide a cured object having excellent balance between various characteristics such as heat resistance and water resistance, and can be used for materials and adhesive applications in electrical and electronic fields; a resin composition using the same; a circuit board material; and a cured object obtained therefrom.

That is, the present invention provides a phenoxy resin represented by Formula (1) below and having a weight average molecular weight of 10,000 to 200,000.

[Chem. 1]

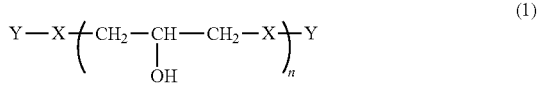

In Formula (1), X's each independently represent a divalent group having an aromatic ring structure and/or an aliphatic ring structure, and at least two of X are a group ($X^1$) represented by Formula (2) below and a group ($X^2$) represented by Formula (3) below. Y's each independently represent a hydrogen atom or a glycidyl group. n is the number of repetitions and an average value thereof is 25 to 500.

[Chem. 2]

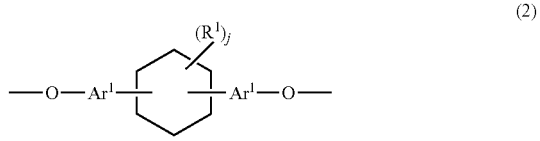

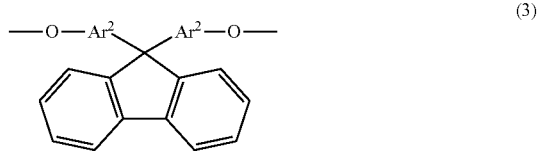

In Formula (2) and Formula (3), $Ar^1$ and $Ar^2$ each independently represent an aromatic ring group including either a benzene ring or a naphthalene ring, and these aromatic rings may have an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms as a substituent. $R^1$'s each independently represent an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms. j is an integer of 0 to 10.

When divalent groups that can be present as X are set as a group ($X^1$) represented by Formula (2), a group ($X^2$)

represented by Formula (3) and another group ($X^3$), and abundances thereof are set as X1, X2 and X3, an abundance molar ratio is X1/X2=1/99 to 99/1, and preferably X3/(X1+X2)=50/50 to 0/100.

The other group ($X^3$) is preferably a divalent group represented by Formula (4) below.

[Chem. 3]

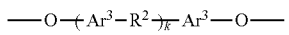
(4)

In Formula (4), $Ar^3$'s each independently represent an aromatic ring group including either a benzene ring or a naphthalene ring, and these aromatic rings may have an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms as a substituent. $R^2$ represents a direct bond, a hydrocarbon group having 1 to 20 carbon atoms, or a divalent group selected from among —CO—, —O—, —S—, —SO$_2$—, and —C(CF$_3$)$_2$—. k is 0 or 1.

In addition, the present invention provides a phenoxy resin obtained by reacting a bifunctional epoxy resin represented by Formula (5) below with a bifunctional phenolic compound represented by Formula (6) below and having a weight average molecular weight of 10,000 to 200,000.

[Chem. 4]

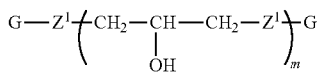
(5)

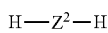
(6)

In Formula (5) and Formula (6), $Z^1$ and $Z^2$ represent a divalent group, and $Z^1$ in Formula (5) and $Z^2$ in Formula (6) include at least one of a group ($X^1$) represented by Formula (2) below and a group ($X^2$) represented by Formula (3). G is a glycidyl group. m is the number of repetitions and an average value thereof is 0 to 6.

In Formulae (5) and (6), a molar ratio between a number of groups ($X^1$) represented by Formula (2) and a number of groups ($X^2$) represented by Formula (3) is preferably 1/99 to 99/1, and preferably, $Z^1$ and/or $Z^2$ include a group ($X^3$) represented by Formula (4), and a proportion of the number of groups ($X^3$) is 50 mol % or less with respect to a total number of moles of $Z^1$ and $Z^2$.

In addition, the present invention provides a resin composition obtained by adding a crosslinking agent or a curable resin component to the phenoxy resin, and preferably, an inorganic filler is additionally added thereto.

The crosslinking agent or curable resin component is preferably at least one selected from among an epoxy resin, an acrylic ester resin, a melanin resin, a urea resin, a phenolic resin, an acid anhydride compound, a polyisocyanate compound, and a block isocyanate compound, and is preferably a bi- or higher functional epoxy resin, a curing agent for an epoxy resin, or a curing accelerator.

In addition, the present invention provides a circuit board material obtained from the resin composition, a cured object obtained from the resin composition, and a laminate obtained by laminating the cured object and a metal in layers.

In addition, the present invention provides a method for producing a phenoxy resin having a weight average molecular weight of 10,000 to 200,000, including reacting a divalent phenolic compound including two types of divalent phenolic compounds represented by Formula (6a) or Formula (6b) below with an epihalohydrin in the presence of an alkali.

[Chem. 5]

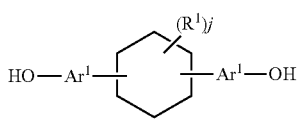
(6a)

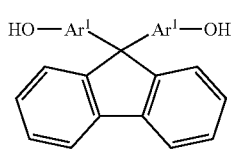
(6b)

In Formula (6a) and Formula (6b), $Ar^1$, Are, $R^1$ and j are the same as those in Formula (2) and Formula (3).

In addition, the present invention provides a method for producing a phenoxy resin having a weight average molecular weight of 10,000 to 200,000, including reacting a bifunctional epoxy resin including a bifunctional epoxy resin represented by Formula (5) with a divalent phenolic compound including a divalent phenolic compound represented by Formula (6) in the presence of a catalyst.

A phenoxy resin of the present invention has excellent heat resistance, flexibility, and water resistance and also has excellent solubility in a solvent. In addition, a resin composition to which the phenoxy resin of the present invention is added provides a cured object having high heat resistance and a low water absorption rate. Since this composition provides a cured object having excellent balance between electrical characteristics and adhesiveness, it can be advantageously used not only in the electrical and electronic fields but also in the pressure-sensitive adhesive and adhesive fields. In particular, this composition is beneficial for use as an adhesive for a laminated plate for a printed wiring board, a build-up insulation layer, a flexible printed wiring board or a metal core laminated plate, or as a resist ink, a liquid semiconductor sealing material, an underfill material, a die bonding material, or an adhesive improving agent or a flexibility-imparting agent in electrical and electronic applications.

BRIEF DESCRIPTION OF DRAWINGS

FIG. 1 is a GPC chart of a phenoxy resin obtained in Example 1.

FIG. 2 is an IR chart of the phenoxy resin obtained in Example 1.

DESCRIPTION OF EMBODIMENTS

Hereinafter, embodiments of the present invention will be described in detail.

A phenoxy resin of the present invention is represented by Formula (1), and has a weight average molecular weight (Mw) measured by gel permeation chromatography (GPC), which is 10,000 to 200,000, preferably 20,000 to 150,000, more preferably 25,000 to 100,000, and still more preferably 30,000 to 80,000. When the Mw is low, film-forming properties and stretchability are poor, and when the Mw is too high, handling properties of the resin significantly deteriorate. A measurement method by GPC is performed according to conditions described in examples.

Unless otherwise specified, the phenoxy resin of the present invention is a general term for a high-molecular-weight epoxy resin having an epoxy group (glycidyl group) at both ends, a high-molecular-weight phenolic resin having a phenolic hydroxyl group at both ends, and a high-molecular-weight resin in which terminal epoxy groups and terminal phenolic hydroxyl group coexist. Generally, since a reaction at the epoxy group is not considered for the phenoxy resin, it is not necessary to particularly specify the epoxy equivalent (g/eq.), but it may be 4,000 or more. When the epoxy equivalent (g/eq.) is less than 4,000, this is not preferable because film-forming properties and stretchability are poor.

In addition, similarly, considering that a phenolic hydroxyl group is provided at both ends, the phenolic hydroxyl group equivalent (g/eq.) may be 4,000 or more. When the phenolic hydroxyl group equivalent (g/eq.) is less than 4,000, this is not preferable because film-forming properties and stretchability are poor. That is, the phenoxy resin of the present invention has an epoxy equivalent and a phenolic hydroxyl group equivalent which are both preferably 4,000 or more.

In Formula (1), X represents a divalent group having an aromatic ring structure and/or an aliphatic ring structure.

Y's each independently represent a hydrogen atom or a glycidyl group.

n is the number of repetitions and an average value thereof is 25 to 500, and is preferably 40 to 400, more preferably 50 to 350, and still more preferably 70 to 300. n is related to the above Mw.

X includes, essentially, a group ($X^1$) including a cyclohexanediol group (cyclohexane ring structure) represented by Formula (2) and a group ($X^2$) including a 9H-fluorene-9,9-diyl group (fluorene ring structure), and may include other groups ($X^3$).

In Formula (2), $Ar^1$ represents an aromatic ring group including either a benzene ring or a naphthalene ring. Further, these aromatic ring groups may be composed of only a benzene ring or a naphthalene ring or may have $R^1$ as a substituent. Here, $R^1$ represents an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms.

The alkyl group having 1 to 10 carbon atoms may be linear, branched, or cyclic, and examples thereof include a methyl group, an ethyl group, an n-propyl group, an n-butyl group, an n-pentyl group, an n-hexyl group, an n-heptyl group, an n-octyl group, an n-nonyl group, an n-decyl group, an isopropyl group, a sec-butyl group, a t-butyl group, an isopentyl group, a neopentyl group, a t-pentyl group, an isohexyl group, a cyclopentyl group, a cyclohexyl group, a cycloheptyl group, a methylcyclohexyl group, a cyclooctyl group, a dimethylcyclohexyl group, an ethylcyclohexyl group, a trimethylcyclohexyl group, and a cyclodecyl group.

The alkoxy group having 1 to 10 carbon atoms may be linear, branched, or cyclic, and examples thereof include a methoxy group, an ethoxy group, an n-propoxy group, an n-butoxy group, an n-pentyloxy group, an n-hexyloxy group, an n-heptyloxy group, an n-octyloxy group, an n-nonyloxy group, an n-decyloxy group, an isopropoxy group, a sec-butoxy group, a t-butoxy group, an isopentyloxy group, a neopentyloxy group, a t-pentyloxy group, an isohexyloxy group, a cyclopentyloxy group, a cyclohexyloxy group, a cycloheptyloxy group, a methylcyclohexyloxy group, a cyclooctyloxy group, a dimethylcyclohexyloxy group, an ethylcyclohexyloxy group, a trimethylcyclohexyloxy group, and a cyclodecyloxy group.

Examples of aryl groups or aryloxy groups having 6 to 11 carbon atoms include a phenyl group, a tolyl group, an ethylphenyl group, a xylyl group, a propylphenyl group, a mesitylene group, a naphthyl group, a methylnaphthyl group, a phenoxy group, a tolyloxy group, an ethylphenoxy group, a xylyloxy group, a propylphenoxy group, a mesityloxy group, a naphthyloxy group, and a methylnaphthyloxy group.

Examples of aralkyl groups or aralkyloxy groups having 7 to 12 carbon atoms include a benzyl group, a methylbenzyl group, a dimethylbenzyl group, a trimethylbenzyl group, a phenethyl group, a 1-phenylethyl group, a 2-phenylisopropyl group, a naphthylmethyl group, a benzyloxy group, a methylbenzyloxy group, a dimethylbenzyloxy group, a trimethylbenzyloxy group, a penethyloxy group, a 1-phenylethyloxy group, a 2-phenylisopropyloxy group, and a naphthylmethyloxy group.

$Ar^1$ is preferably an aromatic ring group including a phenylene group or a naphthalene group, or one in which a phenylene group or a naphthalene group is substituted with a methyl group or a 1-phenyl ethyl group.

In Formula (2), $R^1$ is the same as $R^1$ as a substituent for an aromatic ring group in the above $Ar^1$.

$R^1$ is preferably a methyl group, an ethyl group, an isopropyl group, a t-butyl group, a cyclohexyl group, or a phenyl group, and more preferably a methyl group, an ethyl group, a t-butyl group or a cyclohexyl group.

In Formula (2), j is an integer of 0 to 10, and is preferably 1 to 4 and more preferably 1 to 3.

In Formula (2), preferable examples of cyclohexane ring structures include a cyclohexylene group, a methylcyclohexylene group, a dimethylcyclohexylene group, a methylisopropylcyclohexylene group, a cyclohexylcyclohexylene group, a cyclohexylidene group, a methylcyclohexylidene group, a dimethylcyclohexylidene group, a trimethylcyclohexylidene group, a tetramethylcyclohexylidene group, an ethylcyclohexylidene group, an isopropylcyclohexylidene group, a t-butylcyclohexylidene group, a phenylcyclohexylidene group, a cyclohexylcyclohexylidene group, a (methylcyclohexyl)cyclohexylidene group, an (ethylcyclohexyl)cyclohexylidene group, and a (phenylcyclohexyl)cyclohexylidene group.

Among these, a structure in which two $Ar^1$'s in Formula (2) are bonded to one carbon atom of a hydrocarbon group of a cyclohexane ring, that is, a cyclohexylidene group structure, is preferable. Specifically, a cyclohexylidene group, a 3-methylcyclohexylidene group, a 4-methylcyclohexylidene group, a 3,3,5-trimethylcyclohexylidene group, a 3,3,5,5-tetramethylcyclohexylidene group, a 4-t-butylcyclohexylidene group, and a 4-phenylcyclohexylidene group are preferable, and a 4-methylcyclohexylidene group and a 3,3,5-trimethylcyclohexylidene group are more preferable.

Formula (2) is divided into 9 forms of Formulae (2a) to (2i) below. Among these, Formula (2a) and Formula (2i) are preferable.

[Chem. 6]

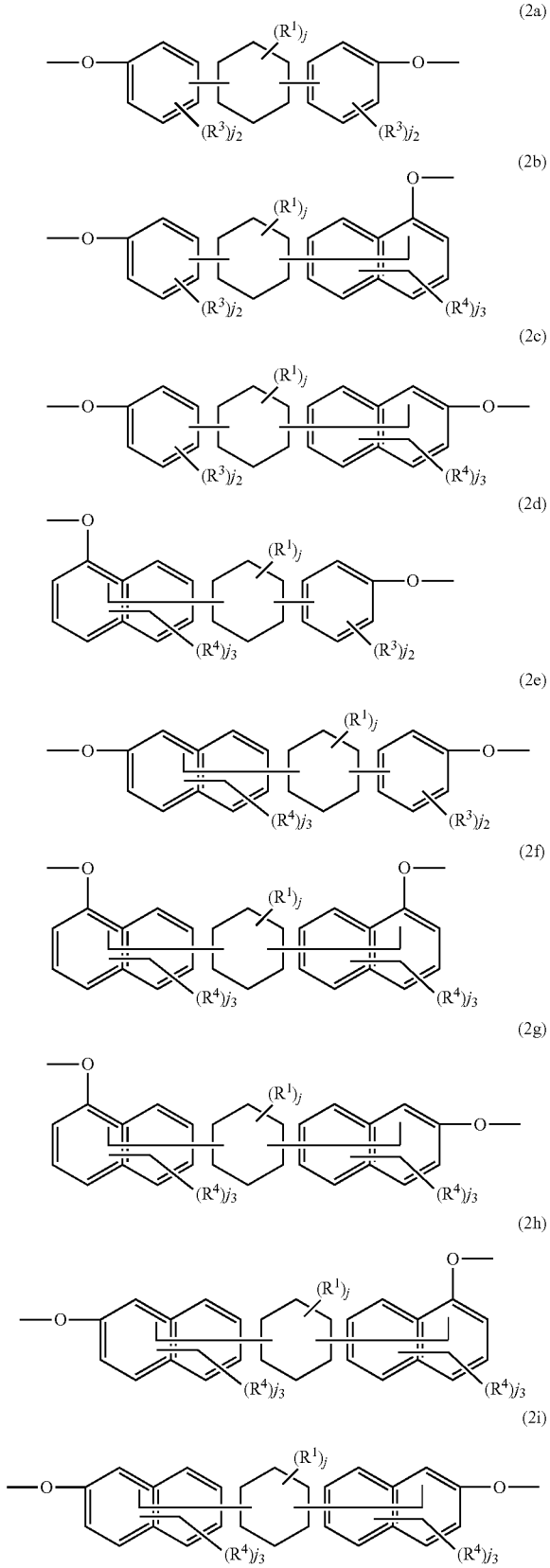

In Formulae (2a) to (2i), $R^3$ and $R^4$ each independently represent the same as for the above $R^1$. j2 is an integer of 0 to 4 and is preferably 0 to 2. j3 is an integer of 0 to 6, and is preferably 0 to 4 and more preferably 0 to 2.

In Formula (2a), the bonding position between a cyclohexane ring and two benzene rings may be any of the 2,2' position, the 2,3' position, the 2,4' position, the 3,3' position, the 3,4' position, and the 4,4' position, and is preferably the 4,4' position. In the above chemical formula, a dash is added to the number of the bonding position for a benzene ring or a naphthalene ring appearing on the right side.

In Formula (2b), the bonding position between a cyclohexane ring, a benzene ring, and a naphthalene ring may be any of the 2,2' position, the 2,3' position, the 2,4' position, the 2,5' position, the 2,6' position, the 2,7' position, the 2,8' position, the 3,2' position, the 3,3' position, the 3,4' position, the 3,5' position, the 3,6' position, the 3,7' position, the 3,8' position, the 4,2' position, the 4,3' position, the 4,4' position, the 4,5' position, the 4,6' position, the 4,7' position, and the 4,8' position, and is preferably the 4,5' position or the 4,6' position.

In Formula (2c), the bonding position between a cyclohexane ring, a benzene ring, and a naphthalene ring may be any of the 2,1' position, the 2,3' position, the 2,4' position, the 2,5' position, the 2,6' position, the 2,7' position, the 2,8' position, the 3,1' position, the 3,3' position, the 3,4' position, the 3,5' position, the 3,6' position, the 3,7' position, the 3,8' position, the 4,1' position, the 4,3' position, the 4,4' position, the 4,5' position, the 4,6' position, the 4,7' position, and the 4,8' position, and is preferably the 4,5' position or the 4,6' position.

In Formula (2d), the bonding position between a cyclohexane ring, a naphthalene ring, and a benzene ring may be any of the 2,1' position, the 2,2' position, the 2,3' position, the 2,4' position, the 3,1' position, the 3,2' position, the 3,3' position, the 3,4' position, the 4,1' position, the 4,2' position, the 4,3' position, the 4,4' position, the 5,1' position, the 5,2' position, the 5,3' position, the 5,4' position, the 6,1' position, the 6,2' position, the 6,3' position, the 6,4' position, the 7,1' position, the 7,2' position, the 7,3' position, the 7,4' position, the 8,1' position, the 8,2' position, the 8,3' position, and the 8,4' position, and is preferably the 5,4' position or the 6,4' position.

In Formula (2e), the bonding position between a cyclohexane ring, a naphthalene ring, and a benzene ring may be any of the 1,1' position, the 1,2' position, the 1,3' position, the 1,4' position, the 3,1' position, the 3,2' position, the 3,3' position, the 3,4' position, the 4,1' position, the 4,2' position, the 4,3' position, the 4,4' position, the 5,1' position, the 5,2' position, the 5,3' position, the 5,4' position, the 6,1' position, the 6,2' position, the 6,3' position, the 6,4' position, the 7,1' position, the 7,2' position, the 7,3' position, the 7,4' position, the 8,1' position, the 8,2' position, the 8,3' position, and the 8,4' position, and is preferably the 5,4' position or the 6,4' position.

In Formula (2f), the bonding position between a cyclohexane ring and two naphthalene rings may be any of the 2,2' position, the 2,3' position, the 2,4' position, the 2,5' position, the 2,6' position, the 2,7' position, the 2,8' position, the 3,2' position, the 3,3' position, the 3,4' position, the 3,5' position, the 3,6' position, the 3,7' position, the 3,8' position, the 4,2' position, the 4,3' position, the 4,4' position, the 4,5' position, the 4,6' position, the 4,7' position, the 4,8' position, the 5,2' position, the 5,3' position, the 5,4' position, the 5,5' position, the 5,6' position, the 5,7' position, the 5,8' position, the 6,2' position, the 6,3' position, the 6,4' position, the 6,5' position, the 6,6' position, the 6,7' position, the 6,8' position, the 7,2' position, the 7,3' position, the 7,4' position, the 7,5' position, the 7,6' position, the 7,7' position, the 7,8' position, the 8,2' position, the 8,3' position, the 8,4' position, the 8,5' position, the 8,6' position, the 8,7' position, and the 8,8' position, and is preferably the 6,6' position.

In Formula (2g), the bonding position between a cyclohexane ring and two naphthalene rings may be any of the 2,1' position, the 2,3' position, the 2,4' position, the 2,5' position, the 2,6' position, the 2,7' position, the 2,8' position, the 3,1' position, the 3,3' position, the 3,4' position, the 3,5' position, the 3,6' position, the 3,7' position, the 3,8' position, the 4,1' position, the 4,3' position, the 4,4' position, the 4,5' position, the 4,6' position, the 4,7' position, the 4,8' position, the 5,1' position, the 5,3' position, the 5,4' position, the 5,5' position, the 5,6' position, the 5,7' position, the 5,8' position, the 6,1' position, the 6,3' position, the 6,4' position, the 6,5' position, the 6,6' position, the 6,7' position, the 6,8' position, the 7,1' position, the 7,3' position, the 7,4' position, the 7,5' position, the 7,6' position, the 7,7' position, the 7,8' position, the 8,1' position, the 8,3' position, the 8,4' position, the 8,5' position, the 8,6' position, the 8,7' position, and the 8,8' position, and is preferably the 6,6' position.

In Formula (2h), the bonding position between a cyclohexane ring and two naphthalene rings may be any of the 1,2' position, the 1,3' position, the 1,4' position, the 1,5' position, the 1,6' position, the 1,7' position, the 1,8' position, the 3,2' position, the 3,3' position, the 3,4' position, the 3,5' position, the 3,6' position, the 3,7' position, the 3,8' position, the 4,2' position, the 4,3' position, the 4,4' position, the 4,5' position, the 4,6' position, the 4,7' position, the 4,8' position, the 5,2' position, the 5,3' position, the 5,4' position, the 5,5' position, the 5,6' position, the 5,7' position, the 5,8' position, the 6,2' position, the 6,3' position, the 6,4' position, the 6,5' position, the 6,6' position, the 6,7' position, the 6,8' position, the 7,2' position, the 7,3' position, the 7,4' position, the 7,5' position, the 7,6' position, the 7,7' position, the 7,8' position, the 8,2' position, the 8,3' position, the 8,4' position, the 8,5' position, the 8,6' position, the 8,7' position, and the 8,8' position, and is preferably the 6,6' position.

In Formula (2i), the bonding position between a cyclohexane ring and two naphthalene rings may be any of the 1,1' position, the 1,3' position, the 1,4' position, the 1,5' position, the 1,6' position, the 1,7' position, the 1,8' position, the 3,1' position, the 3,3' position, the 3,4' position, the 3,5' position, the 3,6' position, the 3,7' position, the 3,8' position, the 4,1' position, the 4,3' position, the 4,4' position, the 4,5' position, the 4,6' position, the 4,7' position, the 4,8' position, the 5,1' position, the 5,3' position, the 5,4' position, the 5,5' position, the 5,6' position, the 5,7' position, the 5,8' position, the 6,1' position, the 6,3' position, the 6,4' position, the 6,5' position, the 6,6' position, the 6,7' position, the 6,8' position, the 7,1' position, the 7,3' position, the 7,4' position, the 7,5' position, the 7,6' position, the 7,7' position, the 7,8' position, the 8,1' position, the 8,3' position, the 8,4' position, the 8,5' position, the 8,6' position, the 8,7' position, and the 8,8' position, and is preferably the 6,6' position.

In Formula (3), $Ar^2$ represents an aromatic ring group composed of a benzene ring or a naphthalene ring. Further, these aromatic ring groups may have the above $R^1$ as a substituent.

Also in Formula (3), as in Formula (2), the positions at which a benzene ring or naphthalene ring which is $Ar^2$ is substituted with a fluorene ring can be divided into nine forms.

In Formulae (2a) to (2i), when a cyclohexane ring structure is substituted with a fluorene ring structure, forms corresponding to Formula (2a) and Formula (2i) are prefer-able. In addition, the bonding positions of a fluorene ring and an aromatic ring group (benzene ring, naphthalene ring) are the same as the bonding positions of a cyclohexane ring, a benzene ring, and a naphthalene ring in Formula (2) [Formulae (2a) to (2i)], and the same applies to preferable bonding positions.

When divalent groups that can be present as X are set as a group ($X^1$) represented by Formula (2), a group ($X^2$) represented by Formula (3) and other groups ($X^3$), and abundances thereof are set as X1, X2 and X3, the abundance ratio (molar ratio) thereof is as follows.

X1/X2 is preferably 1/99 to 99/1, more preferably 10/90 to 90/10, still more preferably 20/80 to 80/20, particularly preferably 30/70 to 70/30, and most preferably 40/60 to 60/40. When X1 is small, solvent solubility may deteriorate, and an effect of improving electrical characteristics may be insufficient. When X2 is small, the heat resistance may be insufficient.

In addition, X3/(X1+X2) is preferably 50/50 to 0/100, more preferably 35/65 to 0/100, and still more preferably 20/80 to 0/100. Since ($X^1$) and ($X^2$) are essential and have a structure required for the effects of the present invention to be exhibited, if the abundance of ($X^3$) is large, the effects may not be exhibited, and it is preferable that ($X^3$) be not present. However, it is preferable to determine the abundance of ($X^3$) according to the purpose, for example, for imparting other characteristics, for example, flame retardance, and for improving solvent solubility, electrical characteristics, and the like.

The other group ($X^3$) may have any structure as long as it is a divalent group having an aromatic ring structure or an aliphatic ring structure other than ($X^1$) and ($X^2$), and is more preferably an aromatic group in consideration of heat resistance. In consideration of electrical characteristics, a group having an aliphatic ring structure is more preferable. A divalent group represented by Formula (4) is still more preferable.

In Formula (4), Ara represents an aromatic ring group including either a benzene ring or a naphthalene ring. Further, these aromatic ring groups may have the above $R^1$ as a substituent. The same applies to preferable substituents.

In Formula (4), $R^2$ represents a direct bond, a hydrocarbon group having 1 to 20 carbon atoms, or a divalent group selected from among —CO—, —O—, —S—, —$SO_2$—, and —C($CF_3$)$_2$—. Examples of hydrocarbon groups having 1 to 20 carbon atoms include —$CH_2$—, —CH($CH_3$)—, —$C_2H_4$—, —C($CH_3$)$_2$—, a cyclododecylene group, a cyclopentylidene group, a methylcyclopentylidene group, a trimethylcyclopentylidene group, a cyclooctylidene group, a cyclododecylidene group, a bicyclo[4.4.0]decylidene group, a bicyclohexanediol group, a phenylene group, a xylylene group, a phenylmethylene group, a diphenylmethylene group, a norbornene group, an adamantylene group, a tetrahydrodicyclopentadienylene group, a tetrahydrotricyclopentadienylene group, and a divalent group having a norbornane structure, a tetrahydrodicyclopentadiene structure, or a tetrahydrotricyclopentadiene structure. However, cyclohexane groups and fluorene groups are excluded.

$R^2$ is preferably a direct bond, —$CH_2$—, —CH($CH_3$)—, —C($CH_3$)$_2$—, —CO—, —O—, —S—, —$SO_2$—, a cyclooctylidene group, a cyclododecylidene group, a bicyclohexanediol group or a divalent group having a tetrahydrodicyclopentadiene structure, and more preferably a direct bond, —$CH_2$—, —C($CH_3$)$_2$—, —CO—, —$SO_2$—, or a divalent group having a tetrahydrodicyclopentadiene structure.

In Formula (4), k is 0 or 1.

When k is 1, as in Formula (2), Formula (4) is divided into nine forms in which a cyclohexane ring structure in Formulae (2a) to (2i) is substituted with a divalent group ($R^2$). Among these, forms corresponding to Formula (2a) and Formula (2i) are preferable. In addition, the bonding positions of a divalent group ($R^2$) and an aromatic ring group ($Ar^3$) are the same as the bonding positions of a cyclohexane ring and an aromatic ring group ($Ar^1$) in Formula (2), and the same applies to preferable bonding positions.

When k is 0, Formula (4) represents a phenylenedioxy group which may have a substituent or a naphthalenedioxy group which may have a substituent.

A method for producing a phenoxy resin of the present invention includes the following one-step method and two-step method, and the present invention is not limited thereto. The phenoxy resin of the present invention may be obtained by any production method, but generally the two-step method is preferably used because the phenoxy resin is obtained more easily by the two-step method than the one-step method.

In the one-step method, an epihalohydrin such as epichlorohydrin and epibromohydrin and a mixture containing, essentially, a bifunctional phenolic compound having a cyclohexane ring structure represented by Formula (6a) and a bifunctional phenolic compound having a fluorene ring structure represented by Formula (6b) are reacted in the presence of an alkali metal hydroxide such as sodium hydroxide or a potassium hydroxide.

In Formulae (6a) and (6b), $Ar^1$, Are, $R^1$ and j are the same as those in Formulae (2) and (3).

In the two-step method, a bifunctional epoxy resin represented by Formula (5) and a bifunctional phenolic compound represented by Formula (6) are generally reacted in the presence of a catalyst. Further, ($X^1$) and ($X^2$) are provided at one or both of a bifunctional epoxy resin and a bifunctional phenolic compound.

A phenoxy resin whose weight average molecular weight and epoxy equivalent are set to be within desired ranges by adjusting a molar ratio of an epihalohydrin and a bifunctional phenolic compound prepared in the one-step method and by adjusting a molar ratio of a bifunctional epoxy resin and a bifunctional phenolic compound prepared in the two-step method can be produced.

The bifunctional phenolic compound used in the production of the one-step method and the two-step method is a bifunctional phenolic compound having a cyclohexane ring structure represented by Formula (6), Formula (6a) and/or Formula (6b) or a fluorene ring structure, but other bifunctional phenolic compounds may be used in combination as long as the object of the present invention is not impaired. Examples of bifunctional phenolic compounds that may be used in combination include bisphenols such as bisphenol A, bisphenol F, bisphenol S, bisphenol B, bisphenol E, bisphenol C, and bisphenol acetophenone, monocyclic bifunctional phenols such as biphenols, catechol, resorcinol, and hydroquinone, and dihydroxynaphthalenes. In addition, these may be substituted with a substituent having no adverse effect such as an alkyl group and an aryl group. A plurality of these bifunctional phenolic compounds may be used in combination. Among these, a bifunctional phenolic compound represented by Formula (6c) below that provides Formula (4) is preferable.

[Chem. 7]

(6c)

In Formula (6c), $X^3$ is a group represented by Formula (4).
First, a one-step method will be described.

In the case of the one-step method, with respect to 1 mol of a bifunctional phenolic compound, 0.985 to 1.015 mol, preferably 0.99 to 1.012 mol, and more preferably 0.995 to 1.01 mol of an epihalohydrin is reacted in a non-reactive solvent in the presence of an alkali metal hydroxide, the epihalohydrin is consumed, a condensation reaction is performed so that the weight average molecular weight is 10,000 or more, and thereby a phenoxy resin can be obtained. Here, after the reaction is completed, it is necessary to remove by-produced salts by filtration or washing with water.

A ratio of the bifunctional phenolic compound having a cyclohexane ring structure represented by Formula (6a) used as a raw material in the raw material bifunctional phenolic compound is preferably 1 to 99 mol %, more preferably 10 to 90 mol %, still more preferably 20 to 80 mol %, particularly preferably 30 to 70 mol %, and most preferably 40 to 60 mol %.

A ratio of the bifunctional phenolic compound having a fluorene ring structure represented by Formula (6b) in the raw material bifunctional phenolic compound is preferably 1 to 99 mol %, more preferably 10 to 90 mol %, still more preferably 20 to 80 mol %, particularly preferably 30 to 70 mol %, and most preferably 40 to 60 mol %.

In addition, when a bifunctional phenolic compound other than a bifunctional phenolic compound having a cyclohexane ring structure represented by Formula (6a) and a bifunctional phenolic compound having a fluorene ring structure represented by Formula (6b) is used in combination, a ratio thereof in the raw material bifunctional phenolic compound is preferably 50 mol % or less, more preferably 35 mol % or less, and still more preferably 20 mol % or less so that it does not influence the effect of the present invention.

This reaction can be performed under an atmospheric pressure or a reduced pressure. In the case of a reaction under atmospheric pressure, the reaction temperature is generally preferably 20° C. to 200° C., more preferably 30° C. to 170° C., still more preferably 40° C. to 150° C., and particularly preferably 50° C. to 100° C. In the case of a reaction under a reduced pressure, the temperature is preferably 20° C. to 100° C., more preferably 30° C. to 90° C., and still more preferably 35° C. to 80° C. When the reaction temperature is within this range, side reactions are unlikely to occur, and the reaction can easily proceed. The reaction pressure is generally atmospheric pressure. In addition, when it is necessary to remove reaction heat, generally, it is performed by a method of evaporating, condensing, and refluxing a solvent used by reaction heat, an indirect cooling method or a combination thereof.

Examples of non-reactive solvents include aromatic hydrocarbons such as toluene and xylene, ketones such as methyl ethyl ketone, methyl isobutyl ketone, cyclopentanone, and cyclohexanone, ethers such as dibutyl ether, dioxane, and tetrahydrofuran, alcohols such as ethanol, isopropyl alcohol, and butyl alcohol, cellosolves such as methyl cellosolve and ethyl cellosolve, and glycol ethers such as ethylene glycol dimethyl ether, but the present invention is not particularly limited thereto, and these solvents may be used alone or two or more thereof may be used in combination.

In addition, catalysts can be used. Examples of catalysts that can be used include quaternary ammonium salts such as tetramethylammonium chloride and tetraethylammonium bromide, tertiary amines such as benzyldimethylamine and 2,4,6-tris(dimethylaminomethyl)phenol, imidazoles such as 2-ethyl-4-methylimidazole and 2-phenylimidazole, phosphonium salts such as ethyltriphenylphosphonium iodide, and phosphines such as triphenylphosphine. These catalysts may be used alone or two or more thereof may be used in combination.

Next, a two-step method will be described.

A bifunctional epoxy resin used as a raw material epoxy resin in the two-step method is not particularly limited as long as it is a bifunctional epoxy resin. A bifunctional epoxy resin represented by Formula (5) obtained by reacting a bifunctional phenolic compound having a cyclohexane ring structure represented by Formula (6a) and/or a bifunctional phenolic compound having a fluorene ring structure represented by Formula (6b) with an epihalohydrin is preferable.

In Formula (5), $Z^1$ is a divalent group, and preferably contains at least one of a group ($X^1$) represented by Formula (2) and a group ($X^2$) represented by Formula (3). G is a glycidyl group. m is the number of repetitions and an average value thereof is 0 to 6, preferably 0 to 3, and more preferably 0 to 1.

In the reaction between the bifunctional phenolic compound and an epihalohydrin for obtaining a raw material epoxy resin in the two-step method, an alkali metal hydroxide such as sodium hydroxide or potassium hydroxide having a molar amount of 0.80 to 1.20 times and preferably 0.85 to 1.05 times that of functional groups in the bifunctional phenolic compound is used. If the value is less than this, this is not preferable because the amount of the residual hydrolyzable chlorine increases. A metal hydroxide in an aqueous solution, an alcohol solution or a solid state is used.

In the epoxidation reaction, an excess amount of epihalohydrin with respect to the bifunctional phenolic compound is used. Generally, an epihalohydrin having a molar amount of 1.5 to 15 times, preferably 2 to 10 times, and more preferably 5 to 8 times that of 1 mol of functional groups in the bifunctional phenolic compound is used. If the value is larger than this, the production efficiency decreases, and if the value is less than this, the amount of a high-molecular-weight epoxy resin product increases, which makes it unsuitable as a phenoxy resin raw material.

The epoxidation reaction is generally performed at a temperature of 120° C. or lower. During the reaction, when the temperature is high, the amount of so-called hardly hydrolyzable chlorine increases, which makes it difficult to achieve high purity. The temperature is preferably 100° C. or lower and still more preferably 85° C. or lower.

A bifunctional epoxy resin which is a raw material in the two-step method is preferably a bifunctional epoxy resin represented by Formula (5), but other bifunctional epoxy resins may be used in combination as long as the object of the present invention is not impaired. Examples of bifunctional epoxy resins that can be used together include bisphenol type epoxy resins such as bisphenol A type epoxy resins, bisphenol F type epoxy resins, bisphenol S type epoxy resins, bisphenol acetophenone type epoxy resins, diphenyl sulfide type epoxy resins, and diphenyl ether type epoxy resins, monocyclic bifunctional phenol diglycidyl ethers such as biphenol type epoxy resins and hydroquinone type epoxy resins, dihydroxynaphthalene type epoxy resins, diphenyldicyclopentadiene type epoxy resins, alkylene glycol type epoxy resins, and aliphatic cyclic epoxy resins. These epoxy resins may be substituted with a substituent having no adverse effect such as an alkyl group and an aryl group. A plurality of these epoxy resins may be used in combination. Among these, an epoxy resin having a divalent group represented by Formula (4) is preferable In the case of the two-step method, any compound may be used as long as it can be used as a catalyst and has a catalytic ability to promote a reaction between an epoxy group and a phenolic hydroxyl group. Examples thereof include alkali metal compounds, organophosphorus compounds, tertiary amines, quaternary ammonium salts, cyclic amines, and imidazoles. These catalysts may be used alone or two or more thereof may be used in combination.

Examples of alkali metal compounds include alkali metal hydroxides such as sodium hydroxide, lithium hydroxide, and potassium hydroxide, alkali metal salts such as sodium carbonate, sodium bicarbonate, sodium chloride, lithium chloride, and potassium chloride, alkali metal alkoxides such as sodium methoxide and sodium ethoxide, sodium acetates such as alkali metal phenoxide, sodium hydride, and lithium hydride, and alkali metal salts of organic acids such as sodium stearate.

Examples of organophosphorus compounds include tri-n-propylphosphine, tri-n-butylphosphine, triphenylphosphine, tetramethylphosphonium bromide, tetramethylphosphonium iodide, tetramethylphosphonium hydrooxide, trimethylcyclohexylphosphonium chloride, trimethylcyclohexylphosphonium bromide, trimethylbenzylphosphonium chloride, trimethylbenzylphosphonium bromide, tetraphenylphosphonium bromide, triphenylmethylphosphonium bromide, triphenylmethylphosphonium iodide, triphenylethylphosphonium chloride, triphenylethylphosphonium bromide, triphenylethylphosphonium iodide, triphenylbenzylphosphonium chloride, and triphenylbenzylphosphonium bromide.

Examples of tertiary amines include triethylamine, tri-n-propylamine, tri-n-butylamine, triethanolamine, and benzyldimethylamine. Examples of quaternary ammonium salts include tetramethylammonium chloride, tetramethylammonium bromide, tetramethylammonium hydroxide, triethylmethylammonium chloride, tetraethylammonium chloride, tetraethylammonium bromide, tetraethylammonium iodide, tetrapropylammonium bromide, tetrapropylammonium hydroxide, tetrabutylammonium chloride, tetrabutylammonium bromide, tetrabutylammonium iodide, benzyltrimethylammonium chloride, benzyltrimethylammonium bromide, benzyltrimethylammonium hydroxide, benzyltributylammonium chloride, and phenyltrimethylammonium chloride.

Examples of imidazoles include 2-methylimidazole, 2-phenylimidazole, 2-ethyl-4-methylimidazole, 2-phenyl-4-methylimidazole, 1-benzyl-2-methylimidazole, and 1-benzyl-2-phenylimidazole.

Examples of cyclic amines include 1,4-diazabicyclo [2,2,2] octane (DABCO), 1,8-diazabicyclo [5,4,0]-7-undecene (DBU), 1,5-diazabicyclo [4,3,0]-5-nonene (DBN), tetrahydro-1,4-(morpholine), N-methylmorpholine, and N,N-dimethylaminopyridine (DMAP).

Generally, the amount of a catalyst used is 0.001 to 1 mass % with respect to the reaction solid content. When an alkali metal compound is used as a catalyst, since alkali metal components remain in the phenoxy resin, and deteriorate insulation characteristics of electronic and electrical components and printed wiring boards using the same, a total of the alkali metal content such as lithium, sodium, and potassium in the phenoxy resin is preferably 100 ppm by mass or less, more preferably 60 ppm by mass or less, and still more preferably 50 ppm by mass or less. In addition, even if organophosphorus compounds, tertiary amines, quaternary ammonium salts, cyclic amines, or imidazoles are used as a catalyst, they remain as catalyst residues in the phenoxy resin, and deteriorate insulation characteristics of electronic and electrical components and printed wiring boards like the residues of alkali metal components. Therefore, the content of phosphorus atoms or nitrogen atoms in the phenoxy resin is preferably 300 ppm by mass or less, more preferably 200 ppm by mass or less, and still more preferably 100 ppm by mass or less.

In the case of the two-step method, a solvent may be used, and any solvent may be used as long as it dissolves a phenoxy resin and does not have an adverse effect on the reaction. Examples thereof include aromatic hydrocarbons, ketones, ester solvents, ether solvents, amide solvents, and glycol ether solvents. These solvents may be used alone or two or more thereof may be used in combination.

Examples of aromatic hydrocarbons include benzene, toluene, and xylene.

Examples of ketones include acetone, methyl ethyl ketone, methyl isobutyl ketone, 2-heptanone, 4-heptanone, 2-octanone, cyclopentanone, cyclohexanone, and acetylacetone.

Examples of ester solvents include methyl acetate, ethyl acetate, propyl acetate, butyl acetate, benzyl acetate, ethyl propionate, ethyl butyrate, butyl butyrate, valerolactone, and butyrolactone.

Examples of ether solvents include diethyl ether, dibutyl ether, t-butyl methyl ether, tetrahydrofuran, and dioxane.

Examples of amide solvents include formamide, N-methylformamide, N,N-dimethylformamide, acetamide, N-methylacetamide, N,N-dimethylacetamide, 2-pyrrolidone, and N-methylpyrrolidone.

Examples of glycol ether solvents include ethylene glycol monomethyl ether, ethylene glycol monoethyl ether, ethylene glycol mono-n-butyl ether, ethylene glycol dimethyl ether, ethylene glycol monoethyl ether acetate, diethylene glycol monomethyl ether, diethylene glycol monoethyl ether, diethylene glycol mono-n-butyl ether, diethylene glycol dimethyl ether, diethylene glycol monoethyl ether acetate, propylene glycol monomethyl ether, propylene glycol mono-n-butyl ether, and propylene glycol monomethyl ether acetate.

The amount of the solvent used can be appropriately selected according to reaction conditions, and for example, in the case of the two-step method, the solid content concentration is preferably 35 to 95 mass %. In addition, when a highly viscous product is produced during the reaction, a solvent can be added during the reaction and the reaction can continue. After the reaction is completed, as necessary, the solvent can be removed by distillation or the like or can be additionally added.

In the case of the two-step method, the reaction temperature is set to be within a temperature range in which a catalyst used does not decompose. When the reaction temperature is too high, the produced phenoxy resin may deteriorate, and when the reaction temperature is too low, the reaction may not proceed and a desired molecular weight may not be achieved. Therefore, the reaction temperature is preferably 50° C. to 230° C., more preferably 100° C. to 210° C., and still more preferably 120° C. to 2,000° C. In addition, the reaction time is generally 1 to 12 hours and preferably 3 to 10 hours. When a low-boiling-point solvent such as acetone or methyl ethyl ketone is used, the reaction temperature can be secured by performing the reaction under a high pressure using an autoclave. In addition, when it is necessary to remove reaction heat, generally, it is performed by a method of evaporating, condensing, and refluxing a solvent used by reaction heat, an indirect cooling method, or a combination thereof.

The phenoxy resin of the present invention is a thermoplastic resin that is flexible itself, and can be used alone, and a crosslinking agent or a curable resin component can be added thereto to obtain a thermosetting resin composition.

Examples of crosslinking agents or curable resin components include an epoxy resin, an acrylic ester resin, a phenolic resin, a melanin resin, a urea resin, an unsaturated polyester resin, an alkyd resin, a thermosetting polyimide resin, an acid anhydride compound, a polyisocyanate compound, and a block isocyanate compound. Among these, an epoxy resin, a phenolic resin, a melanin resin, an acid anhydride compound, a polyisocyanate compound, and a block isocyanate compound are preferable, and a bi- or higher functional epoxy resin, a curing agent for an epoxy resin, and a curing accelerator are more preferable. These crosslinking agents or curable resin components may be used alone or two or more thereof may be used in combination.

Examples of curable resin components include a resin composition that cures an epoxy resin with a curing agent, a resin composition that cures an acrylic ester resin with aa radical polymerization initiator, and a resin component that self-polymerizes a phenolic resin, a melanin resin or the like with heat, and examples of crosslinking agents include compounds that are addition-polymerized with a secondary alcoholic hydroxyl group of a phenoxy resin such as an acid anhydride compound, a polyisocyanate compound, and a block isocyanate compound.

The amount of the crosslinking agent or the curable resin component added is preferably 1/99 to 99/1, more preferably 10/90 to 90/10, and still more preferably 25/75 to 75/25 in terms of phenoxy resin/curable resin component (mass ratio). When the curable resin component is added, a material having better heat resistance can be obtained.

When the curable resin component is an epoxy resin, a conventionally known epoxy resin can be used. Here, the epoxy resin refers to an epoxy resin having at least one epoxy group, and an epoxy resin having two or more epoxy groups is preferable, and an epoxy resin having three or more epoxy groups are more preferable. Specific examples thereof include polyglycidyl ether compounds, polyglycidyl amine compounds, polyglycidyl ester compounds, alicyclic epoxy compounds, and other modified epoxy resins. These epoxy resins may be used alone, two or more of the same type of epoxy resin may be used in combination, or different types of epoxy resins may be used in combination.

Specific examples of polyglycidyl ether compounds include bisphenol A type epoxy resins, bisphenol F type epoxy resins, tetramethyl bisphenol F type epoxy resins, biphenol type epoxy resins, hydroquinone type epoxy resins, bisphenol fluorene type epoxy resins, naphthalene diol type epoxy resins, bisphenol S type epoxy resins, diphenyl sulfide type epoxy resins, diphenyl ether type epoxy resins, resorcinol type epoxy resins, phenolic novolac type epoxy resins, cresol novolac type epoxy resins, alkyl novolac type epoxy resins, styrenated phenolic novolac type epoxy resins, bisphenol novolac type epoxy resins, naphthol novolac type epoxy resins, β-naphthol aralkyl type epoxy resins, naphthalenediol aralkyl type epoxy resins, α-naphthol aralkyl type epoxy resins, biphenyl aralkyl phenol type epoxy resins, trihydroxyphenylmethane type epoxy resins, tetrahydroxyphenylethane type epoxy resins, dicyclopentadiene type epoxy resins, alkylene glycol type epoxy resins, and aliphatic cyclic epoxy resins.

Specific examples of polyglycidyl amine compounds include diaminodiphenylmethane type epoxy resins, metaxylene amine type epoxy resins, 1,3-bisaminomethylcyclohexane type epoxy resins, isocyanurate type epoxy resins, aniline type epoxy resins, hydantoin type epoxy resins, and aminophenol type epoxy resins.

Specific examples of polyglycidyl ester compounds include dimer acid type epoxy resins, hexahydrophthalic acid type epoxy resins, and trimellitic acid type epoxy resins.

Examples of alicyclic epoxy compounds include aliphatic cyclic epoxy resins such as Celloxide 2021 (commercially available from Daicel Corporation).

Specific examples of other modified epoxy resins include urethane modified epoxy resins, oxazoridone ring-containing epoxy resins, epoxy-modified polybutadiene rubber derivatives, carboxyl group-terminated butadiene nitrile rubber (CTBN) modified epoxy resins, polyvinylamine polyoxides (for example, divinylbenzene dioxide, trivinylnaphthalene trioxide), and phenoxy resins.

When an epoxy resin is added, a curing agent is also included. The curing agent is a substance that contributes to a crosslinking reaction between epoxy groups of an epoxy resin and/or a chain length extension reaction.

The amount of the curing agent added with respect to 100 parts by mass of an epoxy resin is, as necessary, 0.1 to 100 parts by mass, and is preferably 1 to 80 parts by mass, more preferably 5 to 60 parts by mass, and still more preferably 10 to 60 parts by mass.

The curing agent is not particularly limited, and any generally known epoxy resin curing agent can be used. In order to increase heat resistance, a phenol-based curing agent, an amide-based curing agent and imidazoles are preferable. In addition, in order to reduce water absorbency, an active ester-based curing agent is preferable. Other examples include an amine-based curing agent, an acid anhydride-based curing agent, organic phosphines, a phosphonium salt, a benzo compound, a tetraphenylboronic salt, an organic acid dihydrazide, a boron halide amine complex, a polymercaptan-based curing agent, an isocyanate-based curing agent, and a block isocyanate-based curing agent. These curing agents may be used alone, two or more of the same type of curing agent may be used in combination, or other types may be used in combination.

In addition, when an epoxy resin is added, as necessary, a curing accelerator can be used. Examples of curing accelerators include phosphorus compounds such as imidazoles, tertiary amines, and phosphines, metal compounds, Lewis acids, and amine complex salts. These curing accelerators may be used alone or two or more thereof may be used in combination.

The amount of the curing accelerator added may be appropriately selected according to the purpose of use, and is, as necessary, 0.01 to 15 parts by mass with respect to 100 parts by mass of an epoxy resin component in the resin composition, and is preferably 0.01 to 10 parts by mass, more preferably 0.05 to 8 parts by mass, and still more preferably 0.1 to 5 parts by mass. When the curing accelerator is used, it is possible to lower the curing temperature and shorten the curing time.

Examples of resin compositions that cure an acrylic ester resin as a curable resin component with a radical polymerization initiator include a thermosetting resin composition or photocurable resin composition of a (meth)acrylate compound. The (meth)acrylate compound is an acrylate having at least one or more (meth)acryloyl groups in a molecule used for viscosity adjustment or used as a cure component. A part of the (meth)acrylate compound preferably has two or more (meth)acryloyl groups. The resin composition in this case includes a (meth)acrylate compound, and one or both of a thermal polymerization initiator and a photopolymerization initiator as essential components.

Examples of these (meth)acrylate compounds include monofunctional(meth)acrylic acid ester, multifunctional (meth)acrylate, urethane(meth)acrylate, and epoxy acrylate. These (meth)acrylate compounds may be used alone or two or more thereof may be used in combination.

The compound that can be used as a polymerization initiator for the (meth)acrylate compound is not particularly limited as long as it produces radicals by a method of heating or emitting active energy rays. For example, when curing is performed by heating, any polymerization initiator that can be used in general radical thermal polymerization such as an azo-based polymerization initiator such as azobisisobutyronitrile, benzoyl peroxide, and a peroxide initiator can be used. In addition, when radical polymerization is performed by photoradical polymerization, any polymerization initiator that can be used in general photoradical polymerization such as benzoins, acetophenones, anthraquinones, thioxanthones, ketals, benzophenones, and phosphine oxides can be used. These polymerization photoinitiators may be used alone or two or more thereof may be used in combination. In addition, the photoradical polymerization initiator may be used in combination with an accelerator such as a tertiary amine compound and N,N-dimethylaminobenzoic acid ethyl ester.

In addition, in the resin composition of the present invention, an organic solvent or a reactive diluent can be used for adjusting the viscosity. These organic solvents or reactive diluents may be used alone or two or more thereof may be used in combination.

Examples of organic solvents include amides, ethers, ketones, alcohols, acetic acid esters, benzoic acid esters, cellosolves, carbitols, aromatic hydrocarbons, sulfoxides, alkanes and acetonitrile, and N-methylpyrrolidone.

Examples of reactive diluents include monofunctional glycidyl ethers such as allyl glycidyl ether, bifunctional glycidyl ethers such as propylene glycol diglycidyl ether, multifunctional glycidyl ethers such as trimethylolpropane polyglycidyl ether, glycidyl esters and glycidyl amines.

The amount of such an organic solvent or reactive diluent used as a non-volatile content is preferably 90 mass % or less, and an appropriate type and a use amount thereof are appropriately selected depending on applications. For example, for printed wiring board applications, a polar solvent having a boiling point of 160° C. or lower such as methyl ethyl ketone, acetone, and 1-methoxy-2-propanol is preferable, and a use amount thereof is preferably 40 to 80 mass % in terms of non-volatile content. In addition, for adhesive film applications, for example, ketones, acetic acid esters, carbitols, aromatic hydrocarbons, dimethylformamide, dimethylacetamide, or N-methylpyrrolidone is preferably used, and a use amount thereof is preferably 30 to 60 mass % in terms of non-volatile content.

In the resin composition of the present invention, in order to improve flame retardance of the obtained cured object, various known flame retardants can be used as long as the reliability is not lowered. Examples of flame retardants that can be used include a halogen flame retardant, a phosphorus flame retardant, a nitrogen flame retardant, a silicone flame retardant, an inorganic flame retardant, and an organometallic salt flame retardant. In consideration of the environment, a halogen-free flame retardant is preferable, and a phosphorus flame retardant is particularly preferable. These flame retardants may be used alone, two or more of the same type of flame retardant may be used in combination, or different types of flame retardants may be used in combination.

In addition, in the resin composition, as necessary, other additives such as a filler, a thermoplastic resin, a coupling agent, an antioxidant, a release agent, an anti-foaming agent, an emulsifier, a thixotropy-imparting agent, a smoothing agent, and a pigment can be added as long as characteristics are not impaired.

Examples of fillers include inorganic fillers such as fused silica, crystalline silica, alumina, silicon nitride, boron nitride, aluminum nitride, aluminum hydroxide, calcium hydroxide, magnesium hydroxide, boehmite, talc, mica, clay, calcium carbonate, magnesium carbonate, barium carbonate, zinc oxide, titanium oxide, magnesium oxide, magnesium silicate, calcium silicate, zirconium silicate, barium sulphate, and carbon, fibrous fillers such as carbon fibers, glass fibers, alumina fibers, silica alumina fibers, silicon carbide fibers, polyester fibers, cellulosic fibers, aramid fibers, and ceramic fibers, and fine particle rubber.

In the resin composition of the present invention, a thermoplastic resin other than the phenoxy resin of the present invention may be used in combination. Examples of thermoplastic resins include a phenoxy resin other than the present invention, a polyurethane resin, a polyester resin, a polyethylene resin, a polypropylene resin, a polystyrene resin, an ABS resin, an AS resin, a vinyl chloride resin, a polyvinyl acetate resin, a polymethyl methacrylate resin, a polycarbonate resin, a polyacetal resin, a cyclic polyolefin resin, a polyamide resin, a thermoplastic polyimide resin, a polyamide-imide resin, a polytetrafluoroethylene resin, a polyetherimide resin, a polyphenylene ether resin, a modified polyphenylene ether resin, a polyether sulfone resin, a polysulfone resin, a polyetheretherketone resin, a polyphenylene sulfide resin, and a polyvinylformal resin. In consideration of compatibility, a phenoxy resin other than the present invention is preferable, and in consideration of a low dielectric property, a polyphenylene ether resin or a modified polyphenylene ether resin is preferable.

Examples of other additives include organic pigments such as quinacridone, azo, and phthalocyanine pigments, inorganic pigments such as titanium oxide, metal foil pigments, and rust preventive pigments, UV absorbers such as hindered amine, benzotriazole, and benzophenone absorbers, antioxidants such as hindered phenol, phosphorus, sulfur, and hydrazide antioxidants, release agents such as stearic acid, palmitic acid, zinc stearate, and calcium stearate, and additives such as a leveling agent, a rheology control agent, a pigment dispersant, a cissing inhibitor, and an anti-foaming agent. The amount of these other additives added is preferably in a range of 0.01 to 20 mass % with respect to a total solid content in the resin composition.

The resin composition of the present invention can be obtained by uniformly mixing the above components. A resin composition containing a phenoxy resin, a curable resin component, and as necessary, various additives, can be easily formed into a cured object by the same method as a conventionally known method. Examples of cured objects include molded cured objects such as a laminate, a cast product, a molded product, an adhesive layer, an insulation layer, and a film. Regarding a method of obtaining a cured object, the same method for a known resin composition can be used, and casting, injection, potting, dipping, drip coating, transfer molding, or compression molding, or a method of laminating forms of a resin sheet, a resin-coated copper foil, a prepreg, or the like, heating, pressing, and curing them to form a laminated plate is suitably used. A method of curing a resin composition varies depending on the components added to the resin composition and the amounts added, but generally, the curing temperature is 80° C. to 300° C., and the curing time is 10 to 360 minutes. This heating is preferably performed by a two-step treatment including primary heating at 80° C. to 180° C. for 10 to 90 minutes and secondary heating at 120° C. to 200° C. for 60 to 150 minutes. In addition, in the addition system in which the glass transition temperature (Tg) exceeds the temperature during secondary heating, it is preferable to additionally perform tertiary heating at 150° C. to 280° C. for 60 to 120 minutes. When such secondary heating and tertiary heating are performed, it is possible to reduce curing defects. When a resin semi-cured object such as a resin sheet, a resin-coated copper foil, or a prepreg is produced, generally, a curing reaction of the resin composition proceeds to the extent that the shape can be maintained with heat. When the resin composition includes a solvent, generally, most of the solvent is removed by a method of heating, depressurization, or air drying, but 5 mass % or less of the solvent may remain in the resin semi-cured object.

Regarding usage applications, the resin composition can be applied to various fields such as circuit board materials, sealing materials, casting materials, conductive pastes, adhesives, and insulating materials, and particularly, the resin composition is beneficial as an insulating casting, a laminating material, or a sealing material in electrical and electronic fields.

When the resin composition is made into a plate such as a laminated plate, in consideration of the dimensional stability, the bending strength, and the like, fillers used are preferably fibrous fillers and more preferably glass cloth, glass mat, or glass roving cloth.

When the resin composition is impregnated into a fibrous reinforcing base material, it is possible to create a prepreg used in a printed wiring board or the like. Regarding the fibrous reinforcing base material, for example, inorganic fibers such as glass, a polyester resin, or a woven fabric or non-woven fabric of organic fibers of a polyamine resin, a polyacrylic resin, a polyimide resin, or an aromatic polyamide resin can be used, but the present invention is not limited thereto.

The resin composition of the present invention can be used by molding it into a sheet or film form. In this case, it is possible to make it into a sheet or film using a conventionally known method. The film thickness (μm) of the resin sheet is not particularly limited, and is preferably 10 to 300, more preferably 25 to 200, and still more preferably 40 to 180. The film thickness of the resin sheet when used in a build-up method is particularly preferably 40 to 90 μm. When the film thickness is 10 μm or more, insulation can be obtained, and when the film thickness is 300 μm or less, a circuit distance between electrodes does not become longer than necessary.

A resin-coated metal foil obtained from the resin composition of the present invention will be described. For the metal foil, copper, aluminum, brass, or nickel can be used alone, or an alloy or composite metal foil can be used. A metal foil having a thickness of 9 to 70 μm is preferably used. A method for producing a resin-coated metal foil from a resin composition of the present invention and a metal foil is not particularly limited, and for example, it can be obtained by applying a resin varnish in which the viscosity of the resin composition is adjusted with a solvent to one surface of the metal foil using a roll coater or the like and then performing heating and drying, and semi-curing (B stage) a resin component to form a resin layer. When the resin component is semi-cured, for example, heating and drying can be performed at 100° C. to 200° C. for 1 to 40 minutes. Here, the thickness of the resin part of the resin-coated metal foil is preferably 5 to 110 μm.

In addition, in order to cure the prepreg or insulating adhesive sheet, a method of curing a laminated plate used when a printed wiring board is produced can be generally used, but the present invention is not limited thereto. For example, when a laminated plate is formed using a prepreg, one or more prepregs are laminated, metal foils are disposed on one side or both sides to form a laminate, this laminate is pressurized and heated, the prepregs are cured and integrated, and thereby a laminated plate can be obtained. Here, for the metal foil, copper, aluminum, brass, nickel or the like can be used alone, or an alloy or composite metal foil can be used.

A resin composition of the present invention is produced, and heated and cured to obtain a cured object, and evaluation is performed, and as a result, flame retardance is favorable despite a low actual carbon ratio. This indicates that the material has excellent tracking resistance. Therefore, it is beneficial as a material for a substrate on which a heating component such as an LED is mounted.

EXAMPLES

While the present invention will be described below in detail with reference to examples and comparative examples, the present invention is not limited thereto as long as other examples do not depart from the gist thereof. Unless otherwise specified, parts represents "parts by mass" and % represents "mass %". An analysis method and a measurement method are shown below.

(1) Epoxy Equivalent:

Measurement was performed according to JIS K 7236 standards, and the unit of "g/eq." was used. Specifically, a potentiometric titration device was used, methyl ethyl ketone was used as a solvent, a tetraethylammonium bromide acetic acid solution was added, and a 0.1 mol/L perchloric acid-acetic acid solution was used. Here, for a solvent-diluted product (resin varnish), a numerical value as a solid content conversion value was calculated from the non-volatile content.

(2) Softening Point:

Measurement was performed according to JIS K 7234 standards using a ring and ball method. Specifically, an automatic softening point device (ASP-MG4, commercially available from Meitec Corporation) was used.

(3) Non-Volatile Content:

Measurement was performed according to JIS K 7235 standards. The drying temperature was 200° C., and the drying time was 60 minutes.

(4) Phosphorus Content:

Sulfuric acid, hydrochloric acid, and perchloric acid were added to a specimen, and the sample was heated and wet-ashed, and all phosphorus atoms were converted into an orthophosphoric acid. Metavanadate and molybdate were reacted in a sulfuric acid acidic solution, the absorbance of the produced phosphovanadomolybdic acid complex at 420 nm was measured, and the phosphorus content determined from a calibration curve created in advance was expressed as %

(5) Weight Average Molecular Weight (Mw):

Mw was determined by GPC measurement. Specifically, a main body (HLC-8220GPC commercially available from Tosoh Corporation) including a series of columns (TSKgelG4000H$_{XL}$, TSKgelG3000H$_{XL}$, and TSKgelG2000H$_{XL}$ commercially available from Tosoh Corporation) was used, and the column temperature was set to 40° C. In addition, tetrahydrofuran (THF) was used as an eluent, the flow rate was set to 1 mL/min, and a differential refractive index detector was used as a detector. For a measurement specimen, 50 μL of a specimen obtained by dissolving 0.05 g of a sample in 10 mL THF and performing filtering with a micro filter was used. Conversion was performed from a calibration curve obtained from standard monodisperse polystyrenes (A-500, A-1000, A-2500, A-5000, F-1, F-2, F-4, F-10, F-20, F-40, F-80, and F-128 commercially available from Tosoh Corporation). Here, GPC-8020 model II version 6.00 (commercially available from Tosoh Corporation) was used for data processing.

(6) Glass Transition Temperature (Tg):

Measurement was performed according to IPC-TM-650 2.4.25.c standards. Specifically, the temperature was expressed as an extrapolated glass transition start temperature (Tig) of a DSC chart obtained in the second cycle of differential scanning calorimetry. EXSTAR6000 DSC6200 (commercially available from SII Nano Technology Inc.) was used as a differential scanning calorimeter device. For a measurement specimen, a specimen obtained by punching a resin film, performing laminating, and packing it in an aluminum capsule was used. The measurement was performed over 2 cycles from room temperature to 280° C. at a heating rate of 10° C./min.

(7) Water Absorption Rate:

Measurement was performed using five test pieces obtained by cutting a resin film into a 50 mm×50 mm square. The test pieces were dried using a hot air circulation oven under an air atmosphere at 100° C. for 1 hour, and the mass was then measured immediately. The test pieces were immersed in water at 25° C. and the water absorption rate was determined from the mass increment after 48 hours.

(8) Solvent Solubility:

In the resin varnish, the solvent was removed using a vacuum oven under conditions of 170° C. and 0.2 kPa for 1 hour, and methyl ethyl ketone (MEK) was then mixed, and the mixture was heated to 60° C. and completely dissolved, and an MEK dissolved product having a non-volatile content of 30% was obtained. The solvent solubility was determined according to whether the MEK dissolved product was turbid when cooled to room temperature. A transparent product was evaluated as o, and a slightly turbid product was evaluated as x (9) Flame Retardance:

Evaluation was performed by a vertical method according to UL94VTM (safety certification standard of Underwriters Laboratories Inc.). Evaluation is indicated as VTM-0, VTM-1, or VTM-2. VTM-0 indicates the most excellent flame retardance, and VTM-1 and VTM-2 are inferior in that order.

(10) Copper Foil Peeling Strength:

Measurement was performed according to JIS C 6481 standards.

(11) Coefficient of Moisture Absorption:

Measurement was performed using five test pieces obtained by cutting a cured film into a 50 mm×50 mm square. The test pieces were dried using a hot air circulation oven under an air atmosphere at 125° C. for 24 hours, and the mass was then measured immediately. The test pieces were stored in a treatment tank in which the temperature was adjusted to 85° C. and the humidity was adjusted to 85% RH, and a coefficient of moisture absorption was determined from the mass increment after 168 hours.

The abbreviations used in examples and comparative examples are as follows.

[Epoxy Resins]

A1: 4,4'-(3,3,5-trimethylcyclohexylidene)bisphenol epoxy resin obtained in Synthesis Example 1 (an epoxy equivalent of 219, m≈4.04)

A2: bisphenol fluorene type epoxy resin obtained in Synthesis Example 2 (an epoxy equivalent of 250, m≈4.09, a softening point of 87° C.)

A3: bisphenol A type liquid epoxy resin (YD-8125, an epoxy equivalent of 172, m≈40.01, commercially available from NIPPON STEEL Chemical & Material Co., Ltd.)

A4: 3,3',5,5'-tetramethyl-4,4'-biphenol epoxy resin (YX-4000, an epoxy equivalent of 186, m≈4.06, commercially available from Mitsubishi Chemical Corporation)

A5: phenolic novolac type epoxy resin (YDPN-638, an epoxy equivalent of 177, commercially available from NIPPON STEEL Chemical & Material Co., Ltd.)

A6: dicyclopentadiene/phenolic copolymer epoxy resin (KDCP-130, an epoxy equivalent of 254, commercially available from Kukdo Chemical Co., Ltd.)

Here, m has the same meaning as m in Formula (5).

[Bifunctional Phenolic Compounds]

B1: 4,4'-(3,3,5-trimethylcyclohexylidene)bisphenol (BisP-HTG, a phenolic hydroxyl group equivalent of 155, commercially available from Honshu Chemical Industry Co., Ltd.)

B2: 4,4'-cyclohexylidene bisphenol (Bis-Z, a phenolic hydroxyl group equivalent of 134, commercially available from Honshu Chemical Industry Co., Ltd.)

B3: 9,9'-bis(4-hydroxyphenyl)fluorine (BPF, a phenolic hydroxyl group equivalent of 175, commercially available from Osaka Gas Chemicals Co., Ltd.)

B4: bisphenol A (a phenolic hydroxyl group equivalent of 114 commercially available from NIPPON STEEL Chemical & Material Co., Ltd.)

B5: 10-(2,5-dihydroxyphenyl)-10H-9-oxa-10-phosphaphenanthrene-10-oxide (HCA-HQ, a phenolic hydroxyl group equivalent of 162, a phosphorus content of 9.5%, commercially available from Sanko Chemical Industry Co., Ltd.)

[Catalysts]

C1: 2-ethyl-4-methylimidazole (Curezol 2E4MZ commercially available from Shikoku Chemical Corporation)

C2: triphenylphosphine (reagent)

C3: tris(2,6-dimethoxyphenyl)phosphine (reagent)

[Curing Agent]

D1: diocyandiamide (diocyandiamide, an active hydrogen equivalent of 21 commercially available from Nippon Carbide Industries Co., Inc.)

[Curing Accelerator]

E1: 2-ethyl-4-methylimidazole (Curezol 2E4MZ commercially available from Shikoku Chemical Corporation)

Synthesis Example 1

155 parts of B1, 560 parts of epichlorohydrin (ECH), and 84 parts of diethylene glycol dimethyl ether (DEDM) were put into a glass reaction container including a stirring device, a thermometer, a nitrogen gas introduction device, a cooling pipe, an oil-water separator and a dripping device, and the mixture was heated to 60° C. with stirring. The mixture was uniformly dissolved and 8 parts of a 49% sodium hydroxide aqueous solution was then added, and the mixture was reacted for 2 hours while maintaining the same temperature. Next, after the temperature was raised to 64° C., the pressure was reduced to the extent that water reflux occurred, and 74 parts of a 49% sodium hydroxide aqueous solution was added dropwise over 3 hours. Water refluxed and distilled off during dropwise addition and ECH and DEDM were separated in a separation tank, ECH and DEDM were returned to a reaction container, water was removed from the system and the reaction occurred. After the reaction was completed, dehydration was performed by raising the temperature to 85° C. while maintaining a reduced pressure, and the temperature was raised to 145° C., and the remaining ECH and DEDM were distilled off. The pressure was returned to atmospheric pressure, and 315 parts of methyl isobutyl ketone (MIBK) was added and dissolved. 200 parts of deionized water was added, stirred and left, and a by-product table salt was dissolved in water and removed. Next, 25 parts of a 20% sodium hydroxide aqueous solution was added, and the mixture was stirred and reacted at 80° C. for 2 hours, and purified and reacted. 130 parts of MIBK was added, and washing with water and liquid separation were repeated three times using 60 parts of hot water of about 80° C., and ionic impurities were removed. Under a reduced pressure of 5 mmHg, the temperature was raised to 150° C., MIBK was distilled off, and an epoxy resin (A1) was obtained.

Synthesis Example 2

An epoxy resin (A2) was obtained by performing the same operation using the same device as in Synthesis Example 1 except that 175 parts of B2 was used in place of 155 parts of B1.

Example 1

562 parts of A1, 438 parts of B3, and 375 parts of cyclohexanone were put into the same device as in Synthesis Example 1 at room temperature, the temperature was raised to 145° C. while flowing nitrogen gas and stirring, 0.1 parts of C1 was added, and the temperature was then raised to 165° C., and the reaction occurred at the same temperature for 10 hours. 375 parts of cyclopentanone and 750 parts of methyl ethyl ketone were diluted and mixed, and thereby a phenoxy resin varnish (1) having a non-volatile content of 40% was obtained. GPC of the obtained phenoxy resin varnish (1) is shown in FIG. 1.

In FIG. 1, T represents elution time (min), and E represents potential (mv).

This phenoxy resin varnish was applied to a release film (polyimide film) with a roller coater so that the thickness after the solvent was dried was 60 μm, and dried at 180° C. for 20 minutes, and a dry film obtained from the release film was then peeled off. Two of these dry films were stacked and pressed using a vacuum press machine under conditions of a degree of vacuum of 0.5 kPa, a drying temperature of 200° C., and a press pressure of 2 MPa for 60 minutes, and a phenoxy resin film (1) with a thickness 100 μm was obtained. Here, a spacer with a thickness of 100 μm was used in order to adjust the thickness. The IR of the obtained phenoxy resin film (1) is shown in FIG. 2.

In FIG. 2, Tr represents transmittance (%).

Example 2

The same operation was performed as in Example 1 except that 577 parts of A1 was used in place of 562 parts of A1, 88 parts of B2 and 335 parts of B3 were used in place of 438 parts of B3, and 1.0 part of C2 was used in place of 0.1 parts of C1, and thereby a phenoxy resin varnish (2) and a phenoxy resin film (2) were obtained.

Example 3

The same operation was performed as in Example 1 except that 620 parts of A2 was used in place of 562 parts of A1, 380 parts of B1 was used in place of 438 parts of B3, and 0.5 parts of C3 was used in place of 0.1 parts of C1, and thereby a phenoxy resin varnish (3) and a phenoxy resin film (3) were obtained.

Example 4

The same operation was performed as in Example 1 except that 430 parts of A2 and 190 parts of A3 were used in place of 562 parts of A1, 255 parts of B1 was used in place of 438 parts of B3, and 0.5 parts of C3 was used in place of 0.1 parts of C1, and thereby a phenoxy resin varnish (4) and a phenoxy resin film (4) were obtained.

Example 5

The same operation was performed as in Example 1 except that 350 parts of A1 and 200 parts of A4 were used in place of 562 parts of A1, 450 parts of B3 was used in place of 438 parts of B3, and 1.0 part of C2 was used in place of 0.1 parts of C1, and thereby a phenoxy resin varnish (5) and a phenoxy resin film (5) were obtained.

Example 6

155 parts of B1, 175 parts of B3, 93.2 parts of epichlorohydrin, 390 parts of toluene, 195 parts of n-butyl alcohol, and 125 parts of a 49% sodium hydroxide aqueous solution were put into the same device as in Synthesis Example 1 at room temperature, the mixture was stirred for 11 hours while maintaining the reaction temperature at 70° C. to 75° C., and 8.5 parts of oxalic acid and 75 parts of pure water were then added, the mixture was subjected to neutralization and liquid separation, 650 parts of toluene and 325 parts of n-butyl alcohol were added, 245 parts of pure water was then added, washing with water and liquid separation were performed twice, and reflux and dehydration were then performed, and thereby a phenoxy resin varnish (6) having a non-volatile content of 20.0% was obtained.

The same operation was performed as in Example 1 and thereby a phenoxy resin film (6) was obtained from a phenoxy resin varnish (6).

Comparative Example 1

The same operation was performed as in Example 1 except that 663 parts of A1 was used in place of 562 parts of A1 and 337 parts of B4 was used in place of 438 parts of B3, and thereby a phenoxy resin varnish (H1) and a phenoxy resin film (H1) were obtained.

Comparative Example 2

The same operation was performed as in Example 1 except that 501 parts of A3 was used in place of 562 parts of A1 and 499 parts of B3 was used in place of 438 parts of B3, and thereby a phenoxy resin varnish (H2) and a phenoxy resin film (H2) were obtained.

The epoxy equivalent and Mw were measured using the phenoxy resin varnish and Tg and the water absorption rate were measured using the phenoxy resin film. The results are shown in Table 1.

TABLE 1

|  | Examples | | | | | | Comparative Examples | |
| --- | --- | --- | --- | --- | --- | --- | --- | --- |
|  | 1 | 2 | 3 | 4 | 5 | 6 | 1 | 2 |
| X1 (mol %) | 50.5 | 63.2 | 49.7 | 29.6 | 30.5 | 50.0 | 50.6 | 0 |
| X2 (mol %) | 49.5 | 36.8 | 50.3 | 30.9 | 49.0 | 50.0 | 0 | 49.5 |
| X3 (mol %) | 0 | 0 | 0 | 39.5 | 20.5 | 0 | 49.4 | 50.5 |
| Epoxy equivalent (g/eq.) | 16500 | 12900 | 22100 | 10800 | 10200 | 30500 | 15800 | 16100 |
| Mw | 33200 | 30800 | 52300 | 30500 | 26400 | 54200 | 31200 | 42300 |
| Tg (° C.) | 186 | 182 | 190 | 172 | 179 | 191 | 135 | 161 |
| Water absorption rate (%) | 0.6 | 0.5 | 0.6 | 0.7 | 0.6 | 0.5 | 0.9 | 1.1 |
| Solvent solubility | ○ | ○ | ○ | ○ | ○ | ○ | ○ | x |

Example 7

The same operation was performed as in Example 1 except that 340 parts of A1 and 246 parts of A2 were used in place of 562 parts of A1, and 98 parts of B3 and 316 parts of B5 were used in place of 438 parts of B3, and thereby a phenoxy resin varnish (7) and a phenoxy resin film (7) were obtained.

Comparative Example 3

The same operation was performed as in Example 1 except that 580 parts of A1 was used in place of 562 parts of A1, and 104 parts of B1 and 316 parts of B5 were used in place of 438 parts of B3, and thereby a phenoxy resin varnish (H3) and a phenoxy resin film (H3) were obtained.

The epoxy equivalent and Mw were measured using the phenoxy resin varnish, and the phosphorus content, Tg, the water absorption rate, and the flammability were measured using the phenoxy resin film. The results are shown in Table 2.

TABLE 2

|  | Example 7 | Comparative Example 3 |
| --- | --- | --- |
| X1 (mol %) | 30.8 | 63.0 |
| X2 (mol %) | 30.6 | 0 |
| X3 (mol %) | 38.6 | 37.0 |

TABLE 2-continued

|  | Example 7 | Comparative Example 3 |
|---|---|---|
| Epoxy equivalent (g/eq.) | 17400 | 16800 |
| Mw | 50100 | 47900 |
| Phosphorus content (%) | 3.0 | 3.0 |
| Tg (° C.) | 173 | 152 |
| Water absorption rate (%) | 0.9 | 1.2 |
| Flame retardance | VTM-0 | VTM-1 |

Example 8

250 parts (100 parts of a solid content) of the phenoxy resin varnish (1) obtained in Example 1, 50 parts of A5, 4.5 parts of D1, 0.2 parts of E1, 50 parts of propylene glycol monomethyl ether, and 50 parts of N,N-dimethylformamide were added and uniformly stirred and mixed to obtain a composition varnish (1).

This composition varnish was applied to a release film with a roller coater so that the thickness after the solvent was dried was 60 μm, and dried at 150° C. for 7 minutes, and a dry film obtained from the release film was then peeled off. Two of these dry films were stacked and pressed using a vacuum press machine under conditions of a degree of vacuum of 0.5 kPa, a heating temperature of 200° C., and a press pressure of 2 MPa for 60 minutes, and thereby a cured film (1) with a thickness of 100 μm was obtained. Here, a spacer with a thickness of 100 μm was used in order to adjust the thickness.

In addition, this composition varnish was impregnated into glass cloth (WEA 7628 XS13, a thickness of 0.18 mm, commercially available from Nitto Boseki Co., Ltd.). The impregnated glass cloth was dried in a hot air circulation oven at 150° C. for 7 minutes to obtain a prepreg. The obtained eight prepregs were stacked with copper foils (3EC-III, a thickness of 35 μm, commercially available from Mitsui Mining & Smelting Co., Ltd.) on the top and bottom, and vacuum-pressed under temperature conditions of 130° C.×15 minutes+190° C.×80 minutes at 2 MPa, and thereby a laminated plate (1) with a thickness of 1.6 mm was obtained.

Example 9

The same operation was performed as in Example 8 except that a phenoxy resin varnish (2) was used in place of a phenoxy resin varnish (1), and thereby a cured film (2) and a laminated plate (2) were obtained.

Example 10

The same operation was performed as in Example 8 except that a phenoxy resin varnish (3) was used in place of a phenoxy resin varnish (1), and thereby a cured film (3) and a laminated plate (3) were obtained.

Example 11

The same operation was performed as in Example 8 except that a phenoxy resin varnish (4) was used in place of a phenoxy resin varnish (1), and thereby a cured film (4) and a laminated plate (4) were obtained.

Example 12

The same operation was performed as in Example 8 except that a phenoxy resin varnish (5) was used in place of a phenoxy resin varnish (1), and thereby a cured film (5) and a laminated plate (5) were obtained.

Example 13

The same operation was performed as in Example 8 except that a phenoxy resin varnish (6) was used in place of a phenoxy resin varnish (1), and thereby a cured film (6) and a laminated plate (6) were obtained.

Comparative Example 4

The same operation was performed as in Example 8 except that a phenoxy resin varnish (H1) was used in place of a phenoxy resin varnish (1), and thereby a cured film (H1) and a laminated plate (H1) were obtained.

Comparative Example 5

The same operation was performed as in Example 8 except that a phenoxy resin varnish (H2) was used in place of a phenoxy resin varnish (1), and thereby a cured film (H2) and a laminated plate (H2) were obtained.

Tg and the coefficient of moisture absorption were measured using the cured films obtained in the above examples and comparative examples, and the copper foil peeling strength was measured using the laminated plate. The results are shown in Table 3.

TABLE 3

|  | Examples | | | | | | Comparative Examples | |
|---|---|---|---|---|---|---|---|---|
|  | 8 | 9 | 10 | 11 | 12 | 13 | 4 | 5 |
| Tg (° C.) | 189 | 186 | 192 | 180 | 185 | 189 | 148 | 171 |
| Coefficient of moisture absorption (%) | 1.0 | 0.9 | 1.0 | 1.1 | 1.0 | 1.0 | 1.3 | 1.4 |
| Copper foil peeling strength (KN/m) | 1.8 | 1.6 | 1.4 | 1.6 | 1.7 | 1.8 | 1.8 | 1.6 |

Based on the results of Tables 1 to 3, in the comparative example in which no divalent group having a fluorene ring structure was contained and a divalent group having a cyclohexane ring structure was introduced, the heat resistance deteriorated, and when phosphorus atoms were introduced to impart flame retardance, the flame retardance deteriorated. In the comparative example in which no divalent group having a cyclohexane ring structure was contained and a divalent group having a fluorene ring structure was introduced, the heat resistance and the coefficient of moisture absorption or the water resistance were slightly deteriorated.

On the other hand, it was found that the examples having both divalent groups having a fluorene ring structure and a cyclohexane ring structure had excellent heat resistance and low hygroscopicity, and also had favorable flame retardance.

INDUSTRIAL APPLICABILITY

The phenoxy resin of the present invention is suitable for materials and adhesive applications for electrical and electronic fields such as circuit board materials.

The invention claimed is:

1. A phenoxy resin represented by Formula (1) below and having a weight average molecular weight of 10,000 to 200,000:

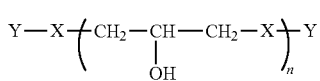  (1)

where, X's each independently represent a divalent group having an aromatic ring structure and/or an aliphatic ring structure, and at least two of X are a group represented by Formula (2) below and a group represented by Formula (3) below; Y's each independently represent a hydrogen atom or a glycidyl group; and n is the number of repetitions and an average value thereof is 25 to 500;

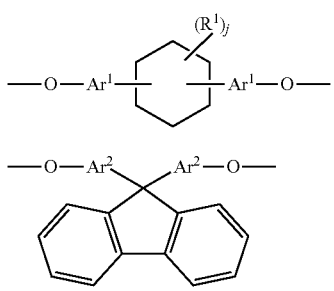

where, Ar¹ and Ar² each independently represent an aromatic ring group composed of a benzene ring or a naphthalene ring, and these aromatic rings may have an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms as a substituent; $R^1$'s each independently represent an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms; and j is an integer of 0 to 10.

2. A phenoxy resin represented by Formula (1) below and having a weight average molecular weight of 10,000 to 200,000:

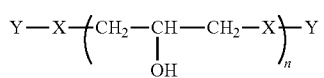  (1)

where, X's each independently represent a divalent group having an aromatic ring structure and/or an aliphatic ring structure, and at least two of X are a group represented by Formula (2) below and a group represented by Formula (3) below; Y's each independently represent a hydrogen atom or a glycidyl group; and n is the number of repetitions and an average value thereof is 25 to 500;

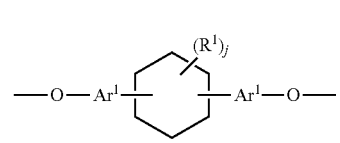

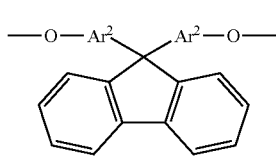

where, Ar¹ and Ar² each independently represent an aromatic ring group composed of a benzene ring or a naphthalene ring, and these aromatic rings may have an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms as a substituent; $R^1$'s each independently represent an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms; and j is an integer of 0 to 10, wherein, when the divalent groups are a group represented by Formula (2), a group represented by Formula (3) and another group, an abundance of the group represented by Formula (2) is set as X1, an abundance of the group represented by Formula (2) is set as X2, an abundance of the another group is set as X3, and an abundance molar ratio is X1/X2=1/99 to 99/1, and X3/(X1+X2)=50/50 to 0/100.

3. The phenoxy resin according to claim 2, wherein the other group is a divalent group represented by Formula (4) below:

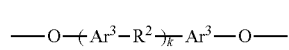  (4)

where, Ar³'s each independently represent an aromatic ring group composed of a benzene ring or a naphthalene ring, and these aromatic rings may have an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms as a substituent; $R^2$ represents a direct bond, a hydrocarbon group having 1 to 20 carbon atoms, or a divalent group selected from among —CO—, —O—, —S—, —SO₂—, and —C(CF₃)₂—; and k is 0 or 1.

4. A resin composition obtained by adding a crosslinking agent or a curable resin component to the phenoxy resin according to claim 2.

5. The resin composition according to claim 4, wherein the crosslinking agent or the curable resin component is at least one selected from among an epoxy resin, an acrylic ester resin, a melamine resin, a urea resin, a phenolic resin, an acid anhydride compound, a polyisocyanate compound, and a block isocyanate compound.

6. The resin composition according to claim 4, wherein the curable resin component includes a bi- or higher functional epoxy resin, a curing agent for an epoxy resin, and a curing accelerator.

7. The resin composition according to claim 4, further comprising an inorganic filler.

8. A circuit board material obtained from the resin composition according to claim 4.

9. A cured product obtained by curing the resin composition according to claim 4.

10. A laminate obtained by laminating a layer formed from the cured product according to claim 9 and a metal layer.

11. A phenoxy resin obtained by reacting a bifunctional epoxy resin represented by Formula (5) below with a bifunctional phenolic compound represented by Formula (6) below and having a weight average molecular weight of 10,000 to 200,000:

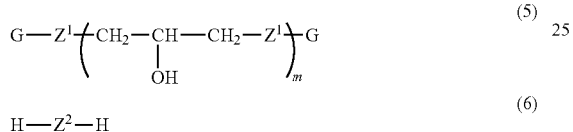

(5)

(6)

where, $Z^1$ and $Z^2$ represent a divalent group having an aromatic ring structure and/or an aliphatic ring structure, and $Z^1$ and $Z^2$ include at least one of a group represented by Formula (2) below and a group represented by Formula (3); G is a glycidyl group; and m is the number of repetitions and an average value thereof is 0 to 6;

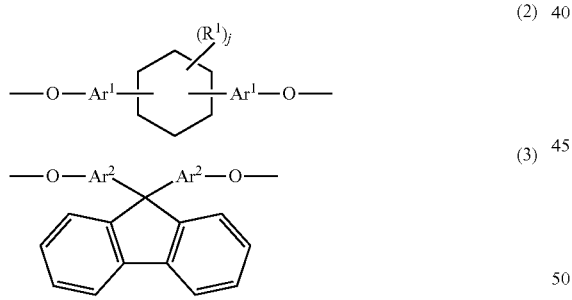

(2)

(3)

where, $Ar^1$ and $Ar^2$ each independently represent an aromatic ring group composed of a benzene ring or a naphthalene ring, and these aromatic rings may have an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms as a substituent; $R^1$'s each independently represent an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms; and j is an integer of 0 to 10.

12. The phenoxy resin according to claim 11, wherein a molar ratio of groups represented by Formula (2) and groups represented by Formula (3) is 1/99 to 99/1.

13. The phenoxy resin according to claim 11, wherein $Z^1$ and/or $Z^2$ include a group represented by Formula (2), a group represented by Formula (3), and another group, and a molar ratio of the other group with respect to a total number of moles of $Z^1$ and $Z^2$ is 50 mol % or less.

14. A method for producing the phenoxy resin according to claim 11, the method comprising:
reacting a bifunctional epoxy resin including the bifunctional epoxy resin represented by Formula (5) with a divalent phenolic compound including the divalent phenolic compound represented by Formula (6) in the presence of a catalyst.

15. A method for producing a phenoxy resin having a weight average molecular weight of 10,000 to 200,000, the method comprising
reacting a mixture including two types of divalent phenolic compounds represented by Formula (6a) and Formula (6b) below with an epihalohydrin in the presence of an alkali:

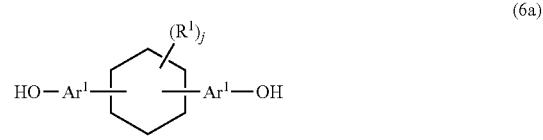

(6a)

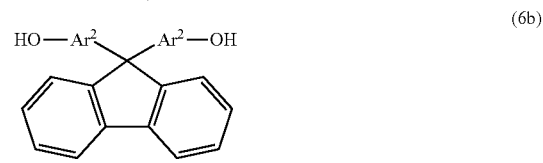

(6b)

where, $Ar^1$ and $Ar^2$ each independently represent an aromatic ring group composed of a benzene ring or a naphthalene ring, and these aromatic rings may have an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms as a substituent; $R^1$'s each independently represent an alkyl group having 1 to 10 carbon atoms, an alkoxy group having 1 to 10 carbon atoms, an aryl group having 6 to 11 carbon atoms, an aralkyl group having 7 to 12 carbon atoms, an aryloxy group having 6 to 11 carbon atoms, or an aralkyloxy group having 7 to 12 carbon atoms; and j is an integer of 0 to 10.

* * * * *